(12) United States Patent
Tihanyi

(10) Patent No.: US 6,284,620 B1
(45) Date of Patent: Sep. 4, 2001

(54) METHOD FOR FABRICATING AN SOI WAFER FOR LOW-IMPEDANCE HIGH-VOLTAGE SEMICONDUCTOR COMPONENTS

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/688,466

(22) Filed: Oct. 16, 2000

Related U.S. Application Data

(63) Continuation of application No. PCT/DE99/00247, filed on Jan. 29, 1999.

(30) Foreign Application Priority Data

Apr. 14, 1998 (DE) ............................................. 198 16 449

(51) Int. Cl.⁷ .................................................. H01L 21/76
(52) U.S. Cl. ............................................ 438/401; 438/462
(58) Field of Search .................................... 438/401, 424, 438/462, 311, 967; 257/347; 117/43

(56) References Cited

U.S. PATENT DOCUMENTS 5,700,712  12/1997  Schwalke .
5,952,694 * 9/1999  Miyawaki et al. .................... 257/347

FOREIGN PATENT DOCUMENTS

19816449A1  10/1999  (DE) .
61-182242    8/1986  (JP) .
4348544     12/1992  (JP) .

* cited by examiner

*Primary Examiner*—Charles Bowers
*Assistant Examiner*—Craig Thompson
(74) *Attorney, Agent, or Firm*—Herbert L. Lerner; Laurence A. Greenberg; Werner H. Stemer

(57) ABSTRACT

A method for fabricating an SOI wafer for low-impedance high-voltage semiconductor components includes producing a semiconductor wafer from a semiconductor substrate, on one outer surface of which a plurality of epitaxial layers are provided. Trenches and a marking groove, which reaches the semiconductor substrate, are introduced into the epitaxial layers. A polycrystalline silicon layer, which is doped with a dopant of one conduction type, is deposited on the surface of the uppermost epitaxial layer, the trenches and the marking groove. The surface of the uppermost epitaxial layer, which is provided with the doped polycrystalline silicon layer, is direct-bonded with an outer surface of a further semiconductor wafer provided with an insulating layer. The semiconductor substrate is removed from its other outer surface. Further trenches are introduced into the lowermost epitaxial layer from the removed surface until the bottom of the trenches is reached. A further polycrystalline silicon layer, which is doped with a dopant of the first conduction type, is applied on the walls of the further trenches so as to produce continuous trenches. The continuous trenches are filled with insulating material.

9 Claims, 2 Drawing Sheets

METHOD FOR FABRICATING AN SOI WAFER FOR LOW-IMPEDANCE HIGH-VOLTAGE SEMICONDUCTOR COMPONENTS

CROSS-REFERENCE TO RELATED APPLICATION

This application is a continuation of copending International Application No. PCT/DE99/00247, filed Jan. 29, 1999, which designated the United States.

BACKGROUND OF THE INVENTION

Field of the Invention

The present invention relates to a method for fabricating an SOI (Silicon On Insulator) wafer for low-impedance high-voltage semiconductor components.

Dielectrically isolated (DI) epitaxial wafers are desirable for a variety of semiconductor components in order to ensure reliable insulation of adjacent components. Single-chip converters are one example thereof.

DI epitaxial wafers have been obtainable heretofore with a thickness of about 20 $\mu$m. However, epitaxial wafers which have a thickness exceeding 20 $\mu$m and, moreover, are dielectrically isolated would be advantageous for a wide variety of application purposes such as, by way of example, for obtaining a particularly high dielectric strength. Such DI epitaxial wafers are SOI wafers, for example, in which one or more epitaxial layers are applied on a substrate.

SUMMARY OF THE INVENTION

It is accordingly an object of the invention to provide a method for fabricating an SOI wafer for low-impedance high-voltage semiconductor components, which overcomes the hereinafore-mentioned disadvantages of the heretofore-known methods of this general type and in which the wafer has a layer thickness of more than 20 $\mu$m.

With the foregoing and other objects in view there is provided, in accordance with the invention, a method for fabricating an SOI wafer for low-impedance high-voltage semiconductor components, which is achieved through the use of the following steps:

(a) A first semiconductor wafer is produced from a semiconductor substrate, on one outer surface of which at least one epitaxial layer is provided.

(b) First trenches are introduced into the at least one epitaxial layer and a marking groove is introduced through the at least one epitaxial layer. The marking groove reaches the semiconductor substrate.

(c) A first layer, which is doped with a dopant of a first conduction type, is deposited on a surface of the at least one epitaxial layer, the first trenches and the marking groove.

(d) A first surface of the at least one epitaxial layer, which is provided with the doped first layer, is direct-bonded with an outer surface of a second semiconductor wafer. The outer surface of the second semiconductor wafer is provided with an insulating layer. The semiconductor substrate is removed from its other outer surface, which is opposite to the first surface, until the bottom of the marking groove is reached.

(e) Second trenches are introduced into the at least one epitaxial layer from the removed surface until the bottom of the first trenches is reached. A second layer, which is doped with a dopant of the first conduction type, is applied on walls of the second trenches so as to produce continuous trenches having walls that are provided with layers which are doped with dopant of the first conduction type.

(f) The continuous trenches are filled with insulating material.

In accordance with another mode of the invention, polycrystalline silicon which is heavily doped with dopant of the first conduction type is advantageously used for the first layer as well as for the second layer and thus for the layers which are doped with dopant of the first conduction type and are applied on the walls of the continuous trenches. However, instead of polycrystalline silicon, it is also possible to use monocrystalline silicon which is likewise heavily doped with dopant of the first conduction type.

In accordance with a further mode of the invention, the insulating material which fills the continuous trenches and, if appropriate, the marking groove as well, is preferably silicon dioxide. It goes without saying, however, that other insulating materials are also possible, such as, for example, silicon nitride or different layers made of silicon dioxide and/or silicon nitride.

In accordance with an added mode of the invention, it is particularly important that floating, island-like semiconductor regions of the second conduction type are introduced into the first semiconductor wafer made from the semiconductor substrate and the at least one epitaxial layer between the semiconductor substrate and the at least one epitaxial layer. If there is a plurality of epitaxial layers, such floating semiconductor regions of the other conduction type are also situated between the individual epitaxial layers. These floating regions may, if appropriate, also be connected in a grid-like manner.

The floating regions are preferably p-doped, so that the semiconductor substrate and the epitaxial layers are n-doped. The doping concentration of the floating regions is chosen to be high enough to ensure that the doping of the floating regions at least corresponds to the doping of the epitaxial layers or of the semiconductor substrate or else is higher than that doping.

In accordance with an additional mode of the invention, the doping per unit area in the floating regions is preferably above $10^{12}$ cm$^{-2}$.

Due to the floating regions, the semiconductor substrate and the at least one epitaxial layer can be doped more heavily with dopant of the first conduction type, with the overall result that a low-impedance wafer is obtained. When a voltage is applied to the wafer, the space charge zone builds up firstly as far as the first plane of the floating regions, that is to say as far as the interface between the uppermost and second-uppermost epitaxial layer and then remains in this plane. This build up of space charge zones progresses from plane to plane, which means that overall, if there are three planes, for example, four times the dielectric strength of a semiconductor wafer without floating regions is achieved. A semiconductor wafer provided with such floating regions is thus particularly suitable for low-impedance high-voltage semiconductor components.

In accordance with yet another mode of the invention, instead of the floating regions, it is also possible, if appropriate, to use homogeneous epitaxial layers, if less value is placed on the dielectric strength given a low resistivity.

In accordance with a concomitant mode of the invention, if appropriate, in addition to the floating regions, trenches with a pn junction ("junction trench") can also be introduced into the epitaxial layers, if the intention is to fabricate especially space-saving semiconductor components.

Other features which are considered as characteristic for the invention are set forth in the appended claims.

Although the invention is illustrated and described herein as embodied in a method for fabricating an SOI wafer for low-impedance high-voltage semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
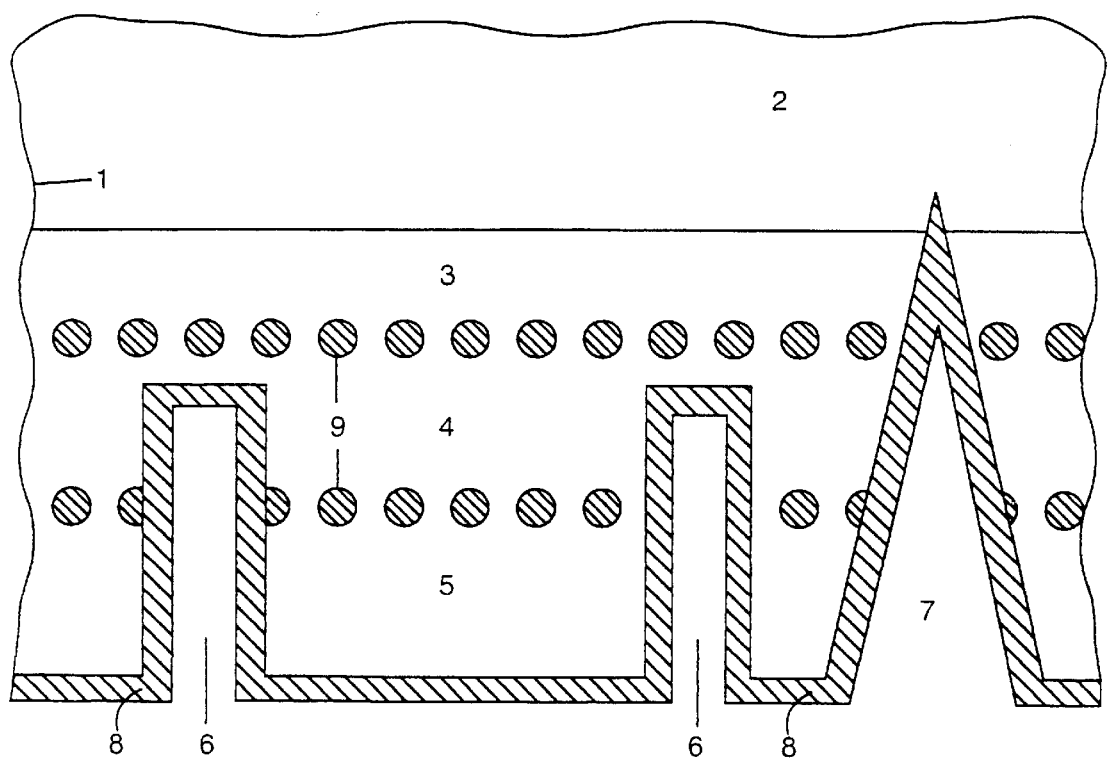
FIGS. 1 to 3 are fragmentary, diagrammatic, sectional views of structures in which some hatching has been omitted for the sake of better clarity.

Referring now to the figures of the drawings in detail and first, particularly, to FIG. 1 thereof, it is seen that the method according to the invention proceeds from a first silicon semiconductor wafer 1 having an n-conducting silicon substrate 2, onto which first, second and third n-conducting epitaxial layers 3, 4 and 5 are applied one after the other. Floating p-conducting regions 9 are situated between the epitaxial layers 3 and 4 as well as between the epitaxial layers 4 and 5. If appropriate, the regions 9 may also be connected in a grid-like manner. Such floating regions 9 may also be present between the substrate 2 and the epitaxial layer 3, although not shown in FIG. 1.

First trenches 6 as well as a marking groove 7 are introduced into the uppermost epitaxial layer 5. In this case, the bottom of the marking groove 7 reaches the silicon substrate 2.

The semiconductor regions 9 are preferably present. However, they need not be present, which means that overall there may be a homogeneous epitaxial structure present. If appropriate, even further trenches, into which pn junctions are introduced, may be present between the trenches 6, if the intention is to fabricate especially space-saving semiconductor components.

An $n^+$-conducting polysilicon layer 8 is applied on the surface of the uppermost epitaxial layer 5, in the trenches 6 and in the marking groove 7. Instead of this polysilicon layer 8, an $n^+$-doped silicon layer formed by diffusion may also be provided, if appropriate.

The structure shown in FIG. 1 is fabricated in a customary manner: initially the first epitaxial layer 3 is applied to the semiconductor substrate 2. The semiconductor regions 9 are then introduced into the surface of the epitaxial layer 3 by diffusion or ion implantation. The semiconductor regions 9 are doped oppositely to the epitaxial layer 3 or to the substrate 2. However, it should be expressly noted, that instead of the dopings specified, that is to say n conduction type for the semiconductor substrate 2 and the epitaxial layers 3, 4 and 5 and p conduction type for the semiconductor regions 9, the opposite conduction types can also be used in each case.

Afterwards, the second epitaxial layer 4 is then applied, which is followed by the introduction of the next plane of semiconductor regions 9. After the application of the uppermost or third epitaxial layer 5, the trenches 6 and the marking groove 7 are introduced by photoresist and etching technology. Finally, the polycrystalline silicon layer 8 is deposited.

Figure 2:
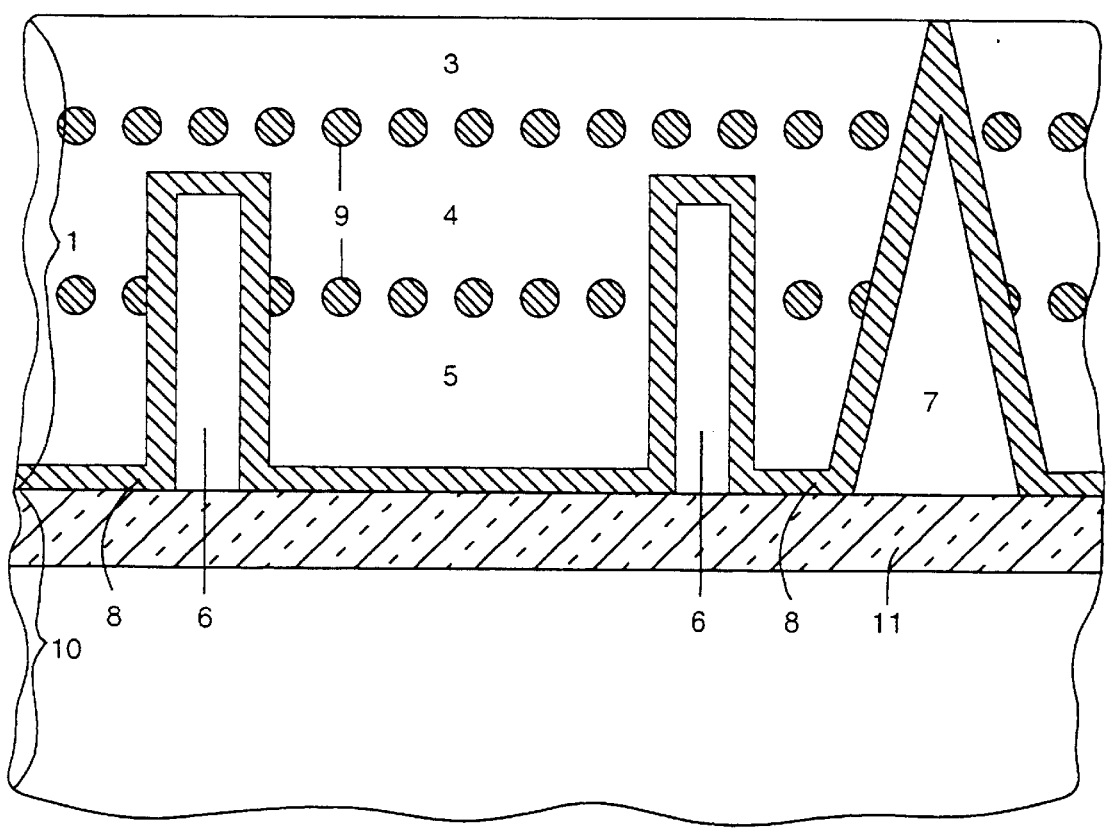

Then, as is shown in FIG. 2, a second silicon wafer 10, which is furnished with a silicon dioxide layer 11, is applied by wafer bonding to the outer surface of the first semiconductor wafer 1. The outer surface of the first semiconductor wafer 1 is provided with the polysilicon layer 8. The semiconductor substrate 2 is then ground until the bottom 12 (indicated in FIG. 3) of the marking groove 7 has been reached. This produces the structure shown in FIG. 2.

Figure 3:
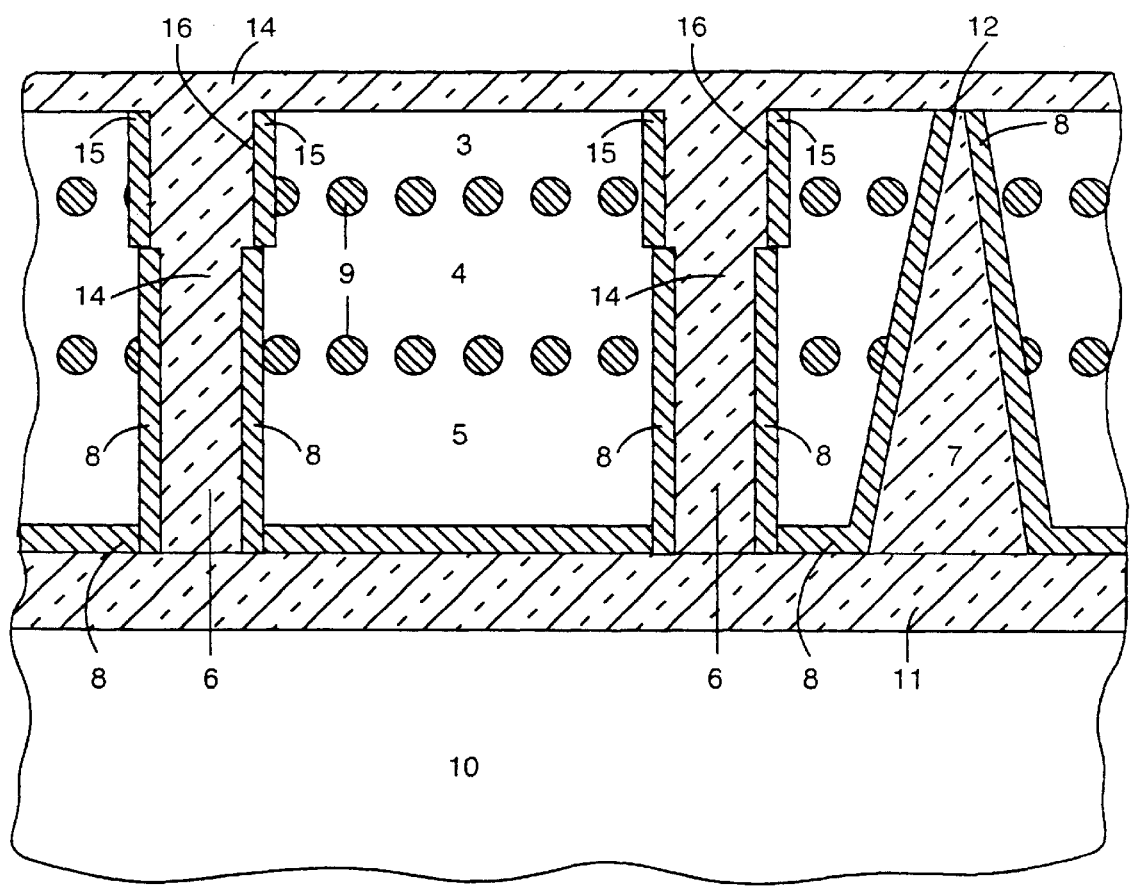

As is shown in FIG. 3, second trenches 16 are then introduced from the side of the epitaxial layer 3. The trenches 16 reach the trenches 6. Walls of these trenches 16 are likewise provided with an $n^+$-doped polycrystalline silicon layer 15. Instead of the polycrystalline silicon layer 15, $n^+$-conducting layers may also be fabricated by diffusion, as was explained above for the layers 8.

Finally, the trenches 6, 16 as well as the marking groove 7 are filled with insulating material 14. This insulating material, preferably silicon dioxide and/or silicon nitride, is also applied to the surface of the epitaxial layer 3.

This produces the structure shown in FIG. 3, in which a "silicon island" including the epitaxial layers 5, 6 and 7 is completely embedded in insulating material including the insulator layer 11 and the insulating material 14 that fills the trenches 6, 16. By way of example, a field-effect transistor and/or an integrated circuit may then be introduced into this semiconductor island in a customary manner.

The layer thickness of the semiconductor wafer which is thus fabricated may be up to 40 μm, since the depth of the individual trenches 6, 16 may be about 20 μm in each case. It is thus possible, therefore, to fabricate DI epitaxial wafers, in a simple manner, which are distinguished by a relatively large layer thickness of up to 40 μm. These epitaxial wafers, if they are specifically furnished with the semiconductor regions 9, are particularly suitable for low-impedance high-voltage semiconductor components.

The method according to the invention therefore makes it possible to fabricate an SOI wafer which is excellently matched to the requirements of low-impedance high-voltage semiconductor components with regard to its doping and its layer thickness.

I claim:

1. A method for fabricating an SOI wafer for low-impedance high-voltage semiconductor components, which comprises the following steps:

(a) producing a first semiconductor wafer from a semiconductor substrate having an outer surface, providing at least one epitaxial layer having first and second mutually opposite outer surfaces, and placing the second outer surface of the at least one epitaxial layer on the outer surface of the semiconductor substrate;

(b) introducing first trenches into the at least one epitaxial layer and introducing a marking groove through the at least one epitaxial layer to reach the semiconductor substrate;

(c) depositing a first layer, doped with a dopant of a first conduction type, on the first outer surface of the at least one epitaxial layer, the first trenches and the marking groove;

(d) providing a second semiconductor wafer having an outer surface, and placing an insulating layer on the outer surface of the second semiconductor wafer;

(e) direct-bonding the first outer surface of the at least one epitaxial layer, provided with the first doped layer, to the outer surface of the second semiconductor wafer having the insulating layer;
(f) removing the semiconductor substrate from the second outer surface of the at least one epitaxial layer until reaching a bottom of the marking groove;
(g) introducing second trenches from the second outer surface of the at least one epitaxial layer until reaching a bottom of the first trenches, and applying a second layer, doped with the dopant of the first conduction type, on walls of the second trenches to produce continuous trenches having walls provided with layers doped with the dopant of the first conduction type; and
(h) filling the continuous trenches with insulating material.

2. The method according to claim 1, which further comprises using polycrystalline silicon heavily doped with the dopant of the first conduction type for at least one of the first and second layers.

3. The method according to claim 1, which further comprises using silicon doped with the dopant of the first conduction type for at least one of the first and second layers.

4. The method according to claim 1, which further comprises carrying out the step of introducing each of the first and second trenches to a depth of about 20 $\mu$m.

5. The method according to claim 1, which further comprises introducing floating semiconductor regions of a second conduction type between the semiconductor substrate and each of the at least one epitaxial layer.

6. The method according to claim 5, which further comprises providing the floating semiconductor regions with a doping per unit area of above $10^{12}$ cm$^{-2}$.

7. The method according to claim 5, which further comprises carrying out the step of introducing the floating regions in a grid-like manner.

8. The method according to claim 5, which further comprises carrying out the step of introducing the floating semiconductor regions by diffusion.

9. The method according to claim 5, which further comprises carrying out the step of introducing the floating semiconductor regions by ion implantation.

* * * * *